(12) United States Patent
Lin et al.

(10) Patent No.: US 11,854,998 B2
(45) Date of Patent: *Dec. 26, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Jing-Cheng Lin, Hsinchu (TW); Chen-Hua Yu, Hsinchu (TW); Po-Hao Tsai, Taoyuan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/853,593

(22) Filed: Jun. 29, 2022

(65) Prior Publication Data

US 2022/0328421 A1    Oct. 13, 2022

Related U.S. Application Data

(63) Continuation of application No. 17/079,704, filed on Oct. 26, 2020, now Pat. No. 11,393,770, which is a continuation of application No. 16/518,568, filed on Jul. 22, 2019, now Pat. No. 10,818,607, which is a continuation of application No. 15/670,187, filed on Aug. 7, 2017, now Pat. No. 10,361,161, which is a continuation of application No. 14/857,939, filed on Sep. 18, 2015, now Pat. No. 9,728,508.

(51) Int. Cl.
  *H01L 23/544*  (2006.01)
  *H01L 23/31*   (2006.01)
  *H01L 23/00*   (2006.01)

(52) U.S. Cl.
  CPC ........ *H01L 23/544* (2013.01); *H01L 23/3135* (2013.01); *H01L 24/19* (2013.01)

(58) Field of Classification Search
  CPC ............. H01L 23/544; H01L 23/49838; H01L 23/498; H01L 2223/54406; H01L 24/19; H01L 23/3135; H01L 2221/68359
  See application file for complete search history.

(56) References Cited

U.S. PATENT DOCUMENTS

| 4,945,204 A | 7/1990 | Nakamura et al. |
| 9,728,508 B2 * | 8/2017 | Lin ..................... H01L 21/6835 |
| 10,361,161 B2 | 7/2019 | Lin et al. |

(Continued)

FOREIGN PATENT DOCUMENTS

| CN | 101219609 A | 7/2008 |
| CN | 104736291 A | 6/2015 |

(Continued)

*Primary Examiner* — Changhyun Yi
(74) *Attorney, Agent, or Firm* — Slater Matsil, LLP

(57) ABSTRACT

A semiconductor device has a conductive via laterally separated from the semiconductor, an encapsulant between the semiconductor device and the conductive via, and a mark. The mark is formed from characters that are either cross-free characters or else have a overlap count of less than two. In another embodiment the mark is formed using a wobble scan methodology. By forming marks as described, defects from the marking process may be reduced or eliminated.

20 Claims, 18 Drawing Sheets

(56) References Cited

U.S. PATENT DOCUMENTS

| | | |
|---|---|---|
| 2005/0012602 A1 | 1/2005 | Knoop et al. |
| 2005/0167800 A1* | 8/2005 | Naya .................... H01L 23/544 |
| | | 257/E23.179 |
| 2006/0165420 A1 | 7/2006 | Larson |
| 2008/0151033 A1 | 6/2008 | Ishimi et al. |
| 2011/0012271 A1 | 1/2011 | Chiu |
| 2013/0157009 A1 | 6/2013 | Kondo |
| 2014/0110384 A1 | 4/2014 | Kleinert et al. |
| 2014/0210080 A1 | 7/2014 | Chang et al. |
| 2014/0262475 A1 | 9/2014 | Liu et al. |
| 2014/0264761 A1 | 9/2014 | Sik et al. |
| 2014/0367160 A1 | 12/2014 | Yu et al. |
| 2015/0130070 A1 | 5/2015 | Lin et al. |
| 2015/0243633 A1 | 8/2015 | Chen |
| 2015/0262922 A1 | 9/2015 | Takahashi |
| 2015/0287700 A1 | 10/2015 | Yu et al. |
| 2015/0348904 A1 | 12/2015 | Huang et al. |
| 2016/0172306 A1 | 6/2016 | Scanlan |
| 2016/0230167 A1 | 8/2016 | Koenig et al. |
| 2017/0047293 A1 | 2/2017 | Moon et al. |

FOREIGN PATENT DOCUMENTS

| | | |
|---|---|---|
| CN | 104882435 A | 9/2015 |
| DE | 102013104455 A1 | 7/2014 |
| JP | 2001066530 A | 3/2001 |
| JP | 2008179135 A | 8/2008 |
| KR | 20150073973 A | 7/2015 |
| KR | 20150101914 A | 9/2015 |

* cited by examiner

SEMICONDUCTOR DEVICE AND METHOD OF MANUFACTURE

PRIORITY CLAIM AND CROSS-REFERENCE

This application is a continuation of U.S. patent application Ser. No. 17/079,704, entitled, "Semiconductor Device and Method of Manufacture," filed on Oct. 26, 2020, which is a continuation of U.S. patent application Ser. No. 16/518,568, entitled, "Semiconductor Device and Method of Manufacture," filed on Jul. 22, 2019, now U.S. Pat. No. 10,818,607 issued on Oct. 27, 2020, which is a continuation of U.S. patent application Ser. No. 15/670,187, entitled, "Semiconductor Device and Method of Manufacture," filed on Aug. 7, 2017, now U.S. Pat. No. 10,361,161, issued on Jul. 23, 2019, which is a continuation of U.S. patent application Ser. No. 14/857,939, entitled, "Semiconductor Device and Method of Manufacture," filed on Sep. 18, 2015, now U.S. Pat. No. 9,728,508, issued on Aug. 8, 2017, which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
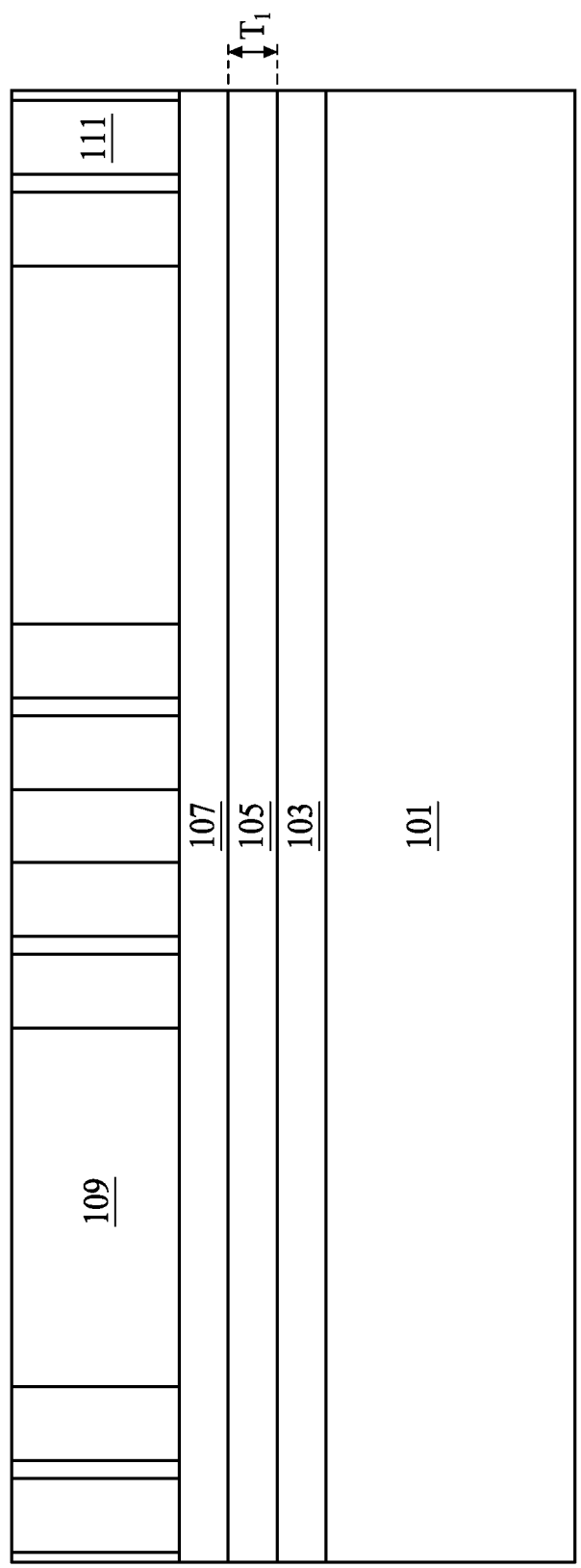
FIG. 1 illustrates a formation of through vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a first carrier substrate 101 with an adhesive layer 103, a polymer layer 105, and a first seed layer 107 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the first carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the first carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide, a polyimide derivative, a Solder Resistance (SR), an Ajinomoto build-up film (ABF), or the like may alternatively be utilized. The polymer layer 105 may be placed using, e.g., a spin-coating process to a first thickness Ti of between about 0.5 µm and about 10 µm, such as about 5 µm, although any suitable method and thickness may alternatively be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium followed by a layer of copper, although any other suitable material or combination of materials, such as a single layer of copper, may also be used. The first seed layer 107 may be created using processes such as sputtering, evaporation, or PECVD processes, depending upon the desired materials.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 µm and about 250 µm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may alternatively be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may alternatively be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
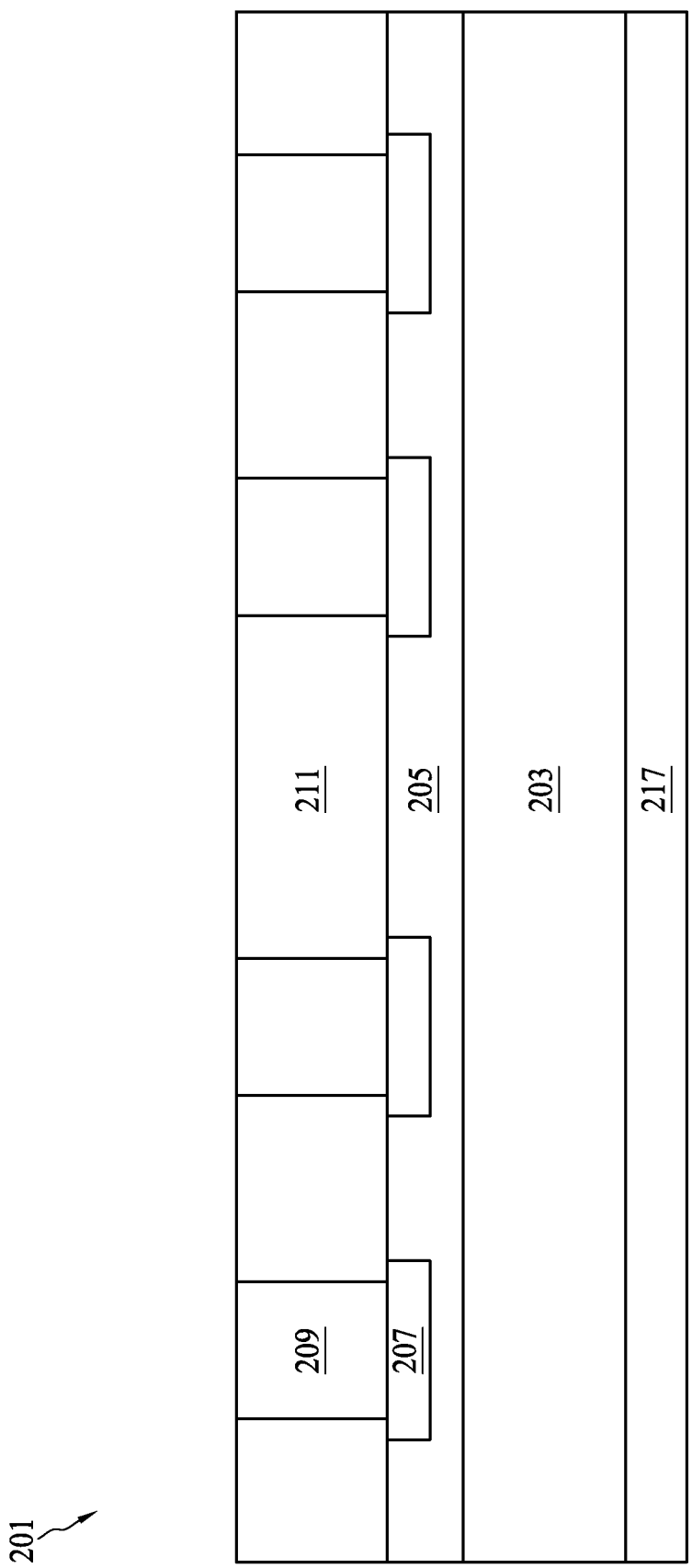
FIG. 2 illustrates a first semiconductor device in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized.

The first external connectors 209 may be formed to provide conductive regions for contact between the first contact pads 207 and, e.g., a redistribution layer 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 µm to about 20 µm. The photoresist may be patterned to expose portions of the first passivation layers 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

A die attach film (DAF) 217 may be placed on an opposite side of the first substrate 203 in order to assist in the attachment of the first semiconductor device 201 to the polymer layer 105. In an embodiment the die attach film 217 is an epoxy resin, a phenol resin, acrylic rubber, silica filler, or a combination thereof, and is applied using a lamination technique. However, any other suitable alternative material and method of formation may alternatively be utilized.

Figure 3:
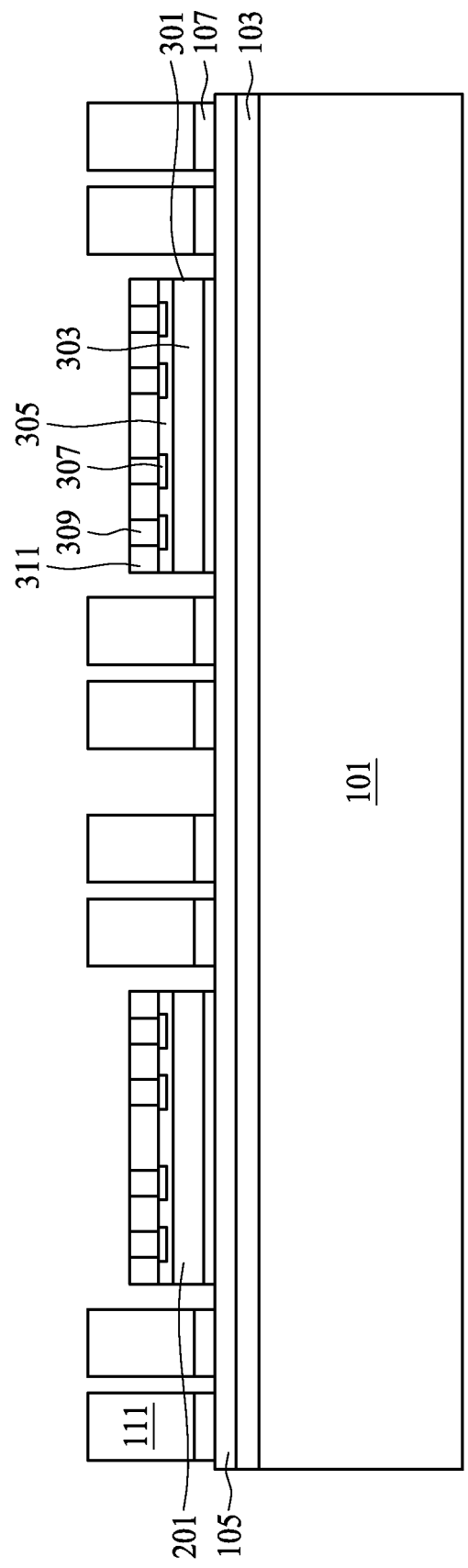
FIG. 3 illustrates a placement of the first semiconductor device and a second semiconductor device in accordance with some embodiments.

FIG. 3 illustrates a placement of the first semiconductor device 201 onto the polymer layer 105 along with a placement of the second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other method of placing the first semiconductor device 201 and the second semiconductor device 301 may also be utilized.

Figure 4:
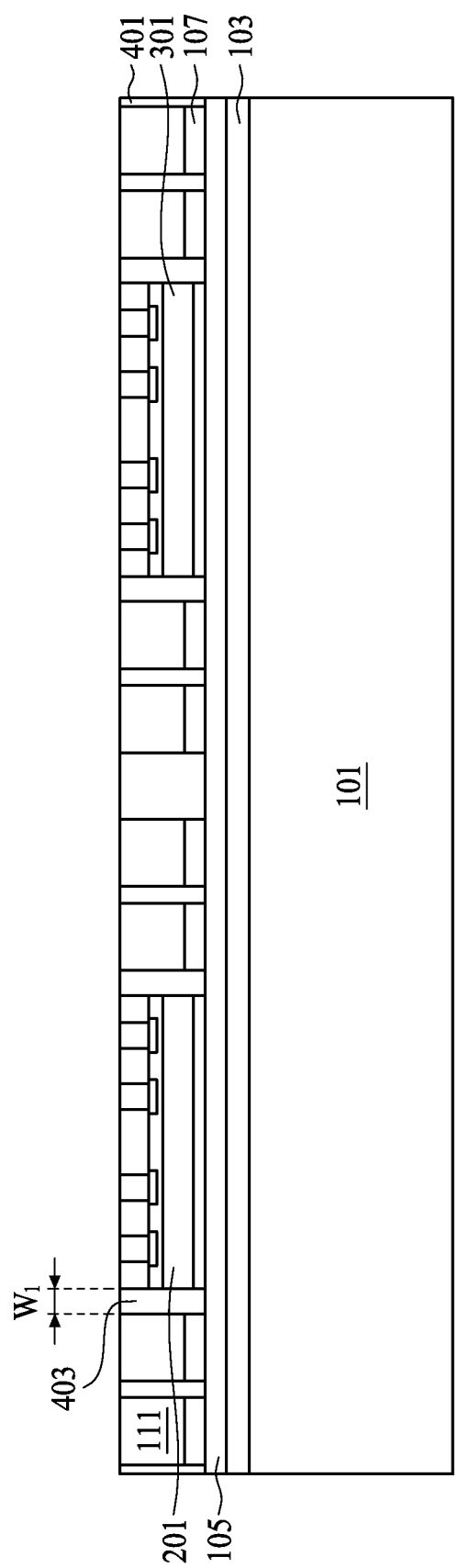
FIG. 4 illustrates a placement of an encapsulant in accordance with some embodiments.

FIG. 4 illustrates an encapsulation of the vias 111, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the first carrier substrate 101, the vias 111, the first semiconductor device 201, and the second semiconductor device 301.

During the encapsulation process the top molding portion may be placed adjacent to the bottom molding portion, thereby enclosing the first carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C. for about 60 sec to about 3000 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also planar with the encapsulant 401.

By thinning the encapsulant 401 such that the vias 111, the first semiconductor device 201, and the second semiconductor device 301 are exposed, there is a first region 403 of encapsulant 401 that is located between the vias 111 and the first semiconductor device 201. In an embodiment the first region 403 of the encapsulant 401 may have a first width $W_1$ of between about 150 μm and about 1600 μm, such as about 850 μm. However, any suitable dimensions may be utilized.

However, while the CMP process described above is presented as one illustrative embodiment, it is not intended to be limiting to the embodiments. Any other suitable removal process may alternatively be used to thin the encapsulant 401, the first semiconductor device 201, and the second semiconductor device 301 and expose the vias 111. For example, a series of chemical etches may be utilized. This process and any other suitable process may alternatively be utilized to thin the encapsulant 401, the first semiconductor device 201, and the second semiconductor device 301, and all such processes are fully intended to be included within the scope of the embodiments.

Optionally, if desired the vias 111 may be recessed within the encapsulant 401. In an embodiment the recessing may be performed using an etching process such as a wet or dry etching process that selectively removes the exposed surface of the vias 111 without substantially removing the surrounding encapsulant 401 so that the vias 111 are recessed. In an embodiment the recessing may be performed so that the vias 111 are recessed between about 0.05 μm and about 2 μm, such as about 0.1 μm.

Figure 5:
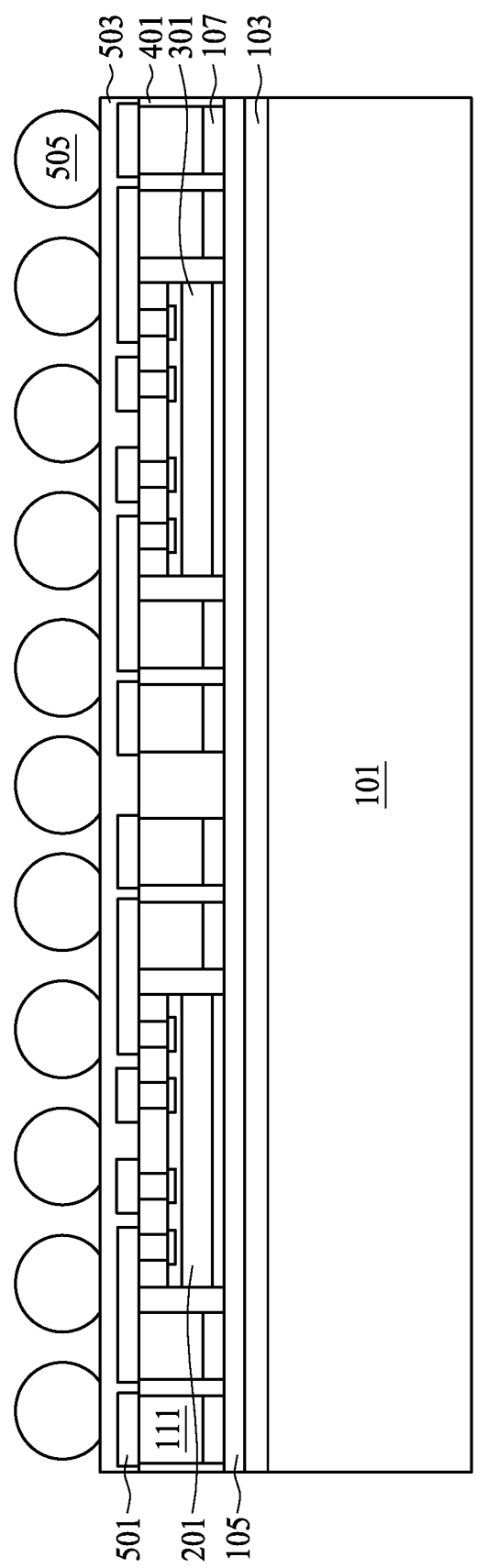
FIG. 5 illustrates a formation of a redistribution layer in accordance with some embodiments.

FIG. 5 illustrates a formation of a redistribution layer (RDL) 501 in order to interconnect the first semiconductor device 201, the second semiconductor device 301, the vias 111 and the third external connectors 505. By using the RDL 501 to interconnect the first semiconductor device 201 and the second semiconductor device 301, the first semiconductor device 201 and the second semiconductor device 301 may have a pin count of greater than 1000.

In an embodiment the RDL 501 may be formed by initially forming a second seed layer (not shown) of a titanium copper alloy through a suitable formation process such as CVD or sputtering. A photoresist (also not shown) may then be formed to cover the second seed layer, and the photoresist may then be patterned to expose those portions of the second seed layer that are located where the RDL 501 is desired to be located.

Once the photoresist has been formed and patterned, a conductive material, such as copper, may be formed on the second seed layer through a deposition process such as plating. However, while the material and methods discussed are suitable to form the conductive material, these materials are merely exemplary. Any other suitable materials, such as AlCu or Au, and any other suitable processes of formation, such as CVD or PVD, may alternatively be used to form the RDL 501.

Once the conductive material has been formed, the photoresist may be removed through a suitable removal process such as ashing. Additionally, after the removal of the photoresist, those portions of the second seed layer that were covered by the photoresist may be removed through, for example, a suitable etch process using the conductive material as a mask.

FIG. 5 also illustrates a formation of a third passivation layer 503 over the RDL 501 in order to provide protection and isolation for the RDL 501 and the other underlying structures. In an embodiment the third passivation layer 503 may be polybenzoxazole (PBO), although any suitable material, such as polyimide or a polyimide derivative, may alternatively be utilized. The third passivation layer 503 may be placed using, e.g., a spin-coating process, although any suitable method may alternatively be used.

In an embodiment the thickness of the structure from the third passivation layer 503 to the polymer layer 105 may be less than or equal to about 200 μm. By making this thickness as small as possible, the overall structure may be utilized in various small size applications, such as cell phones and the like, while still maintaining the desired functionality. However, as one of ordinary skill in the art will recognize, the precise thickness of the structure may be dependent at least in part upon the overall design for the unit and, as such, any suitable thickness may alternatively be utilized.

Additionally, while only a single RDL 501 is illustrated in FIG. 5, this is intended for clarity and is not intended to limit the embodiments. Rather, any suitable number of conductive and passivation layers, such as three RDL 501 layers, may be formed by repeating the above described process to form the RDL 501. Any suitable number of layers may be utilized.

FIG. 5 further illustrates a formation of the third external connectors 505 to make electrical contact with the RDL 501. In an embodiment after the third passivation layer 503 has been formed, an opening may be made through the third passivation layer 503 by removing portions of the third passivation layer 503 to expose at least a portion of the underlying RDL 501. The opening allows for contact between the RDL 501 and the third external connectors 505. The opening may be formed using a suitable photolithographic mask and etching process, although any suitable process to expose portions of the RDL 501 may be used.

In an embodiment the third external connectors 505 may be placed on the RDL 501 through the third passivation layer 503 and may be a ball grid array (BGA) which comprises a eutectic material such as solder, although any suitable materials may alternatively be used. Optionally, an underbump metallization (not separately illustrated) may be utilized between the third external connectors 505 and the RDL 501.

In an embodiment in which the third external connectors 505 are solder balls, the third external connectors 505 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once the third external connectors 505 have been formed, a test may be performed to ensure that the structure is suitable for further processing.

Figure 6:
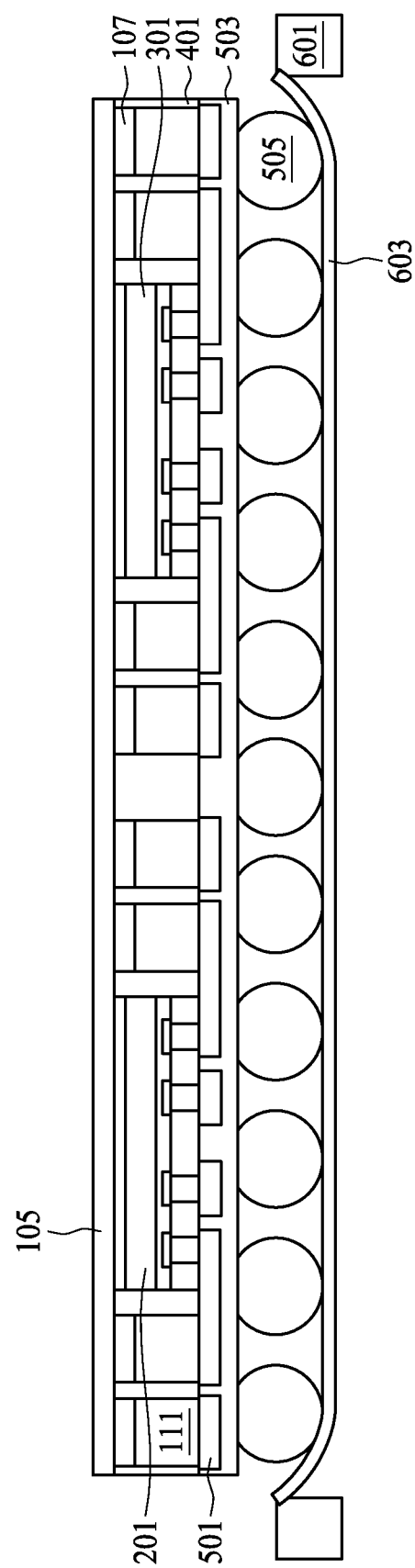
FIG. 6 illustrates a removal of a carrier wafer in accordance with some embodiments.

FIG. 6 illustrates a debonding of the first carrier substrate 101 from the first semiconductor device 201 and the second semiconductor device 301. In an embodiment the third external connectors 505 and, hence, the structure including the first semiconductor device 201 and the second semiconductor device 301, may be attached to a ring structure 601. The ring structure 601 may be a metal ring intended to provide support and stability for the structure during and after the debonding process. In an embodiment the third external connectors 505, the first semiconductor device 201, and the second semiconductor device 301 are attached to the ring structure using, e.g., a ultraviolet tape 603, although any other suitable adhesive or attachment may alternatively be used.

Once the third external connectors 505 and, hence, the structure including the first semiconductor device 201 and the second semiconductor device 301 are attached to the ring structure 601, the first carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 505, the first semiconductor device 201, and the second semiconductor device 301.

Figure 7:
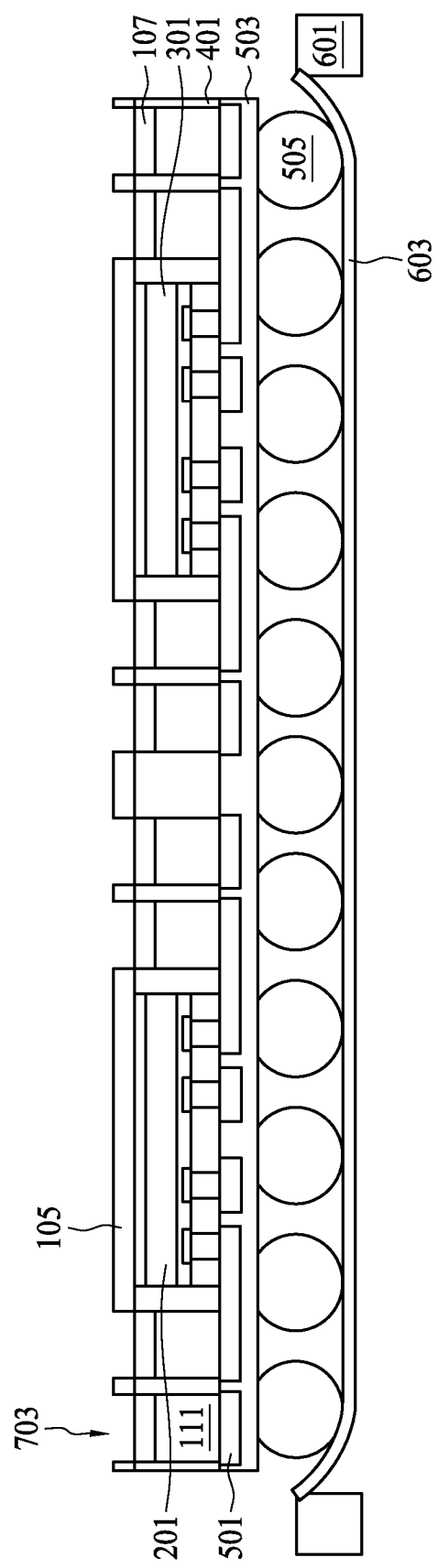
FIG. 7 illustrates a formation of openings in accordance with some embodiments.

FIG. 7 illustrates a patterning of the polymer layer 105 in order to expose the vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 7) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form first openings 703 over the vias 111 to have a width of between about 100 μm and about 300 μm, such as about 200 μm. Once the first openings 703 have been formed with the laser drilling method, the first openings 703 may be cleaned to remove any laser drill residue.

In another embodiment, the polymer layer 105 may be patterned by initially applying a photoresist (not individually illustrated in FIG. 7) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 8A:
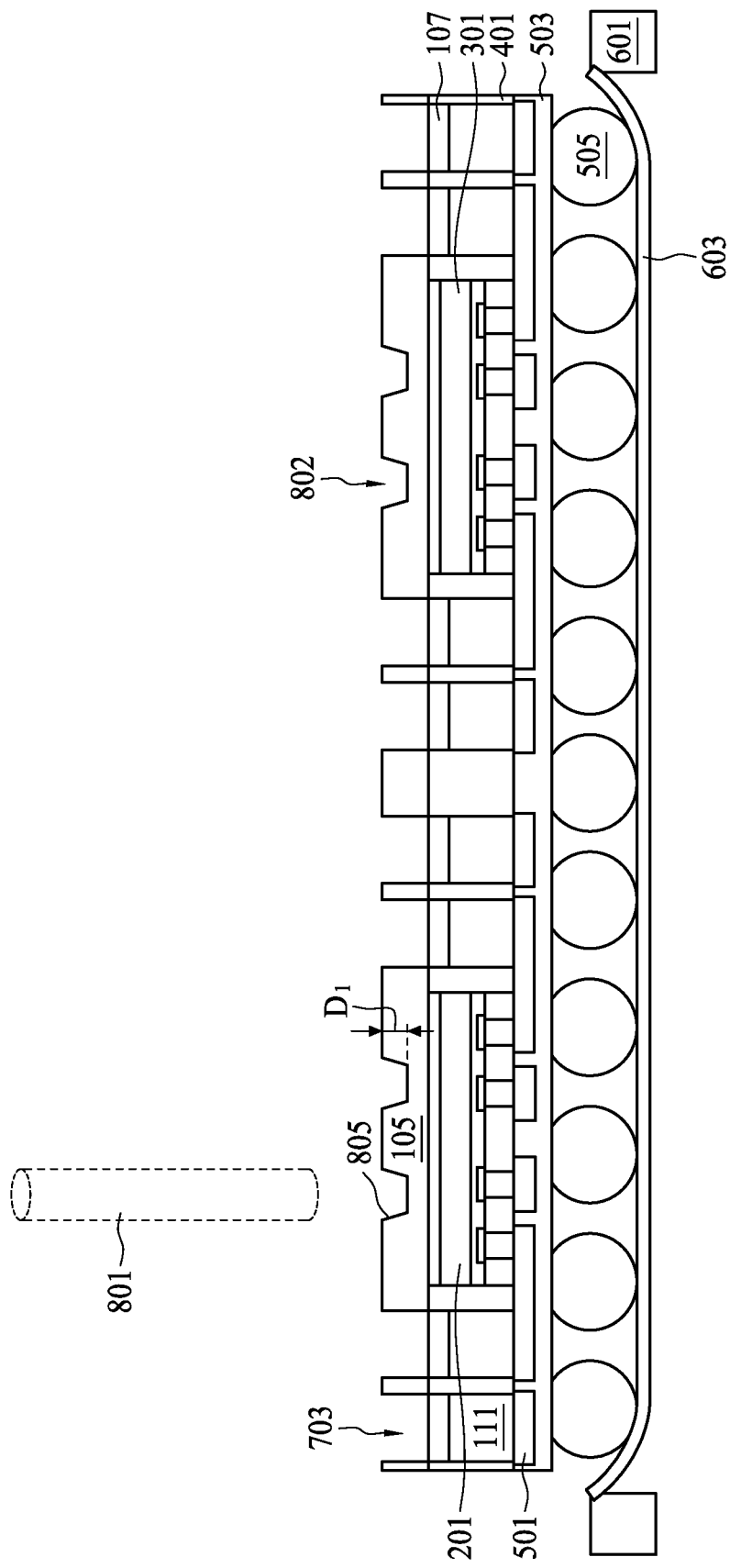
FIGS. 8A-8B illustrates a marking process in accordance with some embodiments.

FIG. 8A illustrates a cross-sectional view of a marking process (represented in FIG. 8A by the dashed cylinder labeled 801) that is utilized to mark the polymer layer 105 with a desired identifying mark 805 (which mark 805 merely appears as second openings 802 in this cross-sectional view of FIG. 8A). In an embodiment the marking process may be, for example, a laser marking process which is used to mark the polymer layer 105 with, e.g., a run number, a manufacturer identifier, a date of manufacture, combinations of these, or the like, with one or more alphanumeric characters as the mark 805. However, any other suitable desired identifying or information mark 805 may be used.

In an embodiment the marking process 801 is utilized to form second openings 802 (also known as kerfs) within the polymer layer 105, wherein when each one of the second openings 802 is taken in combination with one or more of the other second openings 802, the combination of second openings 802 collectively form the desired mark 805 in, e.g., a top down view. However, if the second openings 802 extend too far into the polymer layer 105 or even through the polymer layer 105, there is a possibility that defects may occur from exposure of the underlying first semiconductor device 201 and the second semiconductor device 301, or that, even if the second openings 802 do not extend all of the way through the polymer layer 105, damage may occur due to induced heat spot effects, which could further damage the RDL 501 or the overall functions of the first semiconductor device 201 and the second semiconductor device 301.

Figure 8B:
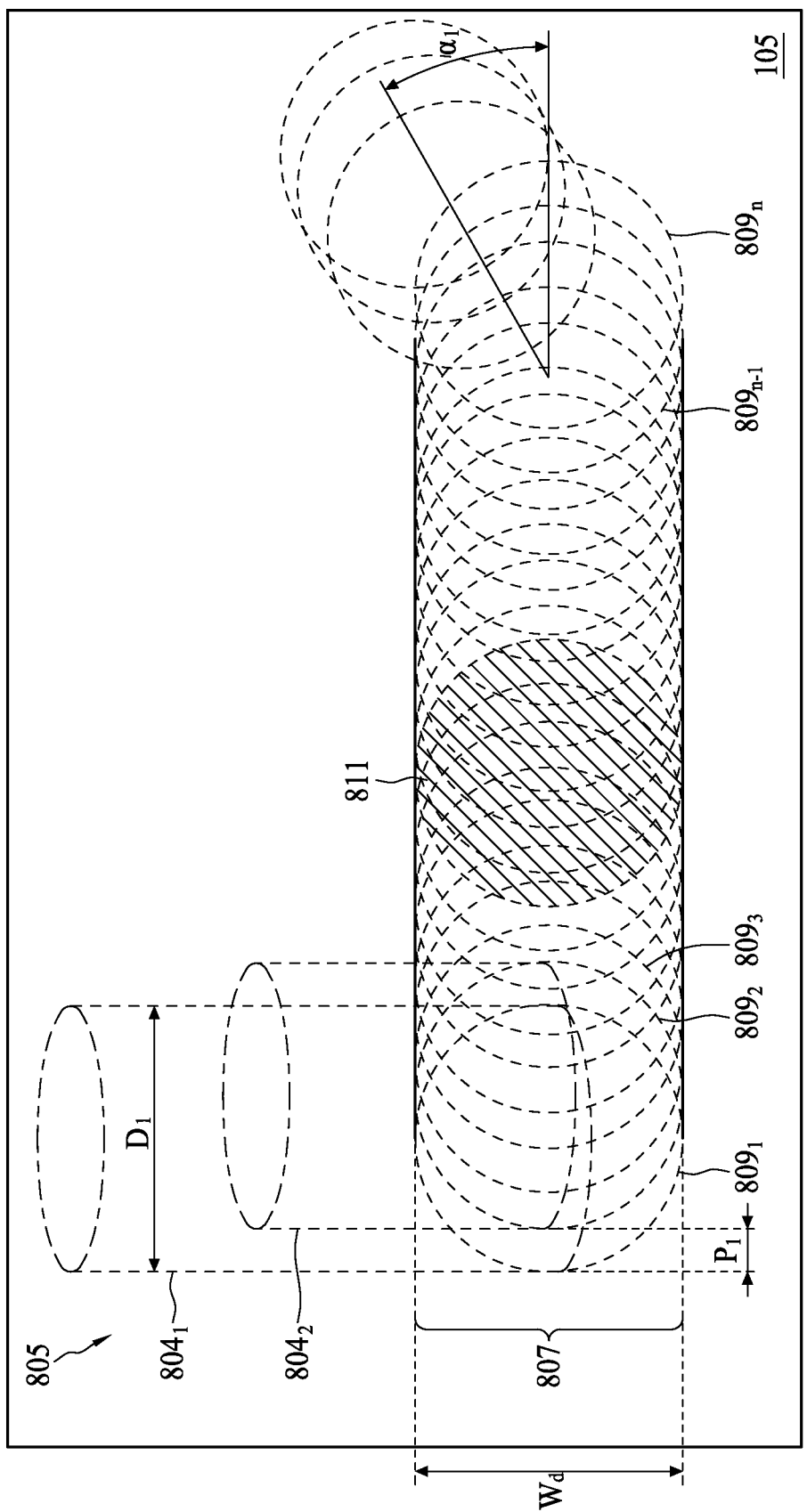

FIG. 8B illustrates a top-down view of one embodiment of the marking process 801 which may be used to mitigate or eliminate these issues during the marking process 801. For clarity, FIG. 8B illustrates a formation of a single first line 807 in an embodiment in which the marking process 801 is a laser marking process, although the first line 807 may be utilized along with other lines (such as a second line 901 and a third line 903, not illustrated in FIG. 8B but illustrated and described further below with respect to FIG. 9A) in order to form any desired shape for the mark 805. In an embodiment the laser marking process may be performed by irradiating the polymer layer 105 with a series of laser pulses (two of which are represented in FIG. 8B by the dashed cylinders labeled $804_1$ and $804_2$ and the rest of which have been removed for clarity) to form the second openings (see FIG. 8A), wherein each one of the series of laser beam pulses 804 forms a laser beam pulse exposure (each of which is represented in FIG. 8B by the dashed circles labeled $809_1$, $809_2$, $809_{n-1}$, $809_n$, etc.).

For example, to begin the laser marking process, a portion of the polymer layer 105 that is desired to be marked may be irradiated with a first one of the laser beam pulses $804_1$ that has a first diameter $D_1$ of between about 20 μm and about 120 μm, such as about 50 μm, that is equal to the desired dot width $W_d$ of the first line 807. Additionally, the first one of the laser beam pulses $804_1$ may have an energy density of between about $1.0 \times 10^{-3}$ J/mm$^2$ and about $5.0 \times 10^{-2}$ J/mm$^2$, such as about $1.5 \times 10^{-2}$ J/mm$^2$. Once the polymer layer 105 has been irradiated, the first one of the laser beam pulses $804_1$ may be maintained for a time of between about $1.0 \times 10^{-5}$ sec and about $8.0 \times 10^{-5}$ sec, such as about $2.8 \times 10^{-5}$ sec, in order to pulse the laser beam and form the first laser beam pulse exposure $809_1$ on the polymer layer 105. During this first one of the laser beam pulses $804_1$, a portion of the polymer layer 105 is removed to form a first one of the first laser beam pulse exposures $809_1$.

Once the first one of the first laser pulse exposures $809_1$ has been formed, the first one of the laser beam pulses $804_1$ is halted. At that time, the laser beam may be moved into position to irradiate the polymer layer 105 with a second one of the laser beam pulses $804_2$ in order to form a second laser beam pulse exposure $809_2$ which overlaps the first laser beam pulse exposure $809_1$. In an embodiment the second laser beam pulse exposure $809_2$ is offset from the first laser beam pulse exposure $809_1$ by a first pitch Pi of between about 2 µm and about 70 µm, such as about 5.7 µm. The second one of the laser beam pulses $804_2$ may be similar to the first one of the laser beam pulses $804_1$, such as by having the first diameter $D_1$, although any other suitable parameters for the second one of the laser beam pulses $804_2$ may be utilized.

After forming the second laser beam pulse exposure $809_2$ overlapping the first laser beam pulse exposure $809_1$, the second one of the laser beam pulses $804_2$ is halted. At that time, the laser beam may be moved into position to irradiate another portion of the polymer layer 105 in order to form a third laser beam pulse exposure $809_3$, which overlaps both the first laser beam pulse exposure $809_1$ and the second laser beam pulse exposure $809_2$. This process of using offset laser beam pulses 804 to form overlapping but offset laser beam pulse exposures 809 within the polymer layer 105 may be continued to form the first line 807, wherein the desired length of the first line 807 is determined by the number of laser beam pulses 804 used to form a desired number of laser beam pulse exposures 809.

However, by overlapping the laser beam pulse exposures 809 (e.g., the first laser beam pulse exposure $809_1$ is overlapped by at least the second laser beam pulse exposure $809_2$ and the third laser beam pulse exposure $809_3$), there will be portions of the laser beam pulse exposures 809 that have been irradiated by multiple ones of the laser beam pulses 804, with each exposure removing additional material from the polymer layer 105 and causing different kerf depths even within the same laser beam pulse exposure 809 (e.g., the first laser beam pulse exposure $809_1$). For example, looking at a fully exposed laser beam pulse exposure 811 (one which is located within an interior of the first line 807 and not at a terminating end of the first line 807 such that there is a maximum overlap amount), there may be a total accumulated overlap within the fully exposed laser beam pulse exposure 811 of between about 100% and about 400%, such as about 376%.

However, when each one of the laser beam pulse exposures 809 is overlapped by a neighboring laser beam pulse exposure 809, each one of the laser beam pulses 804 will remove additional material from the polymer layer 105. For example, in making the first line 807 with a first pass of the laser beam pulses 804, while the individual laser beam pulse exposure 809 may have different depths within the individual laser beam pulse exposures 809, the laser beam pulse exposures 809 may be generally formed to have a deepest first depth $D_1$ that is less than the first thickness Ti (see FIG. 1) of the polymer layer 105, such as by being between about 2 µm and about 10 µm, such as less than about 7.52 µm.

Additionally, in order to help with the overlapping between the individual ones of the laser beam pulse exposures 809, in an embodiment a path angle should be maintained low so that additional overlapping does not occur between a first portion of the first line 807 and a second portion of the first line 807 that is at an angle to the first portion of the first line 807. For example, in an embodiment the marking path may be maintained to have a first angle $\alpha_1$ of between about 20° and about 90°, such as less than about 30°. However, any suitable first angle $\alpha_1$ may be used.

Figure 9A:
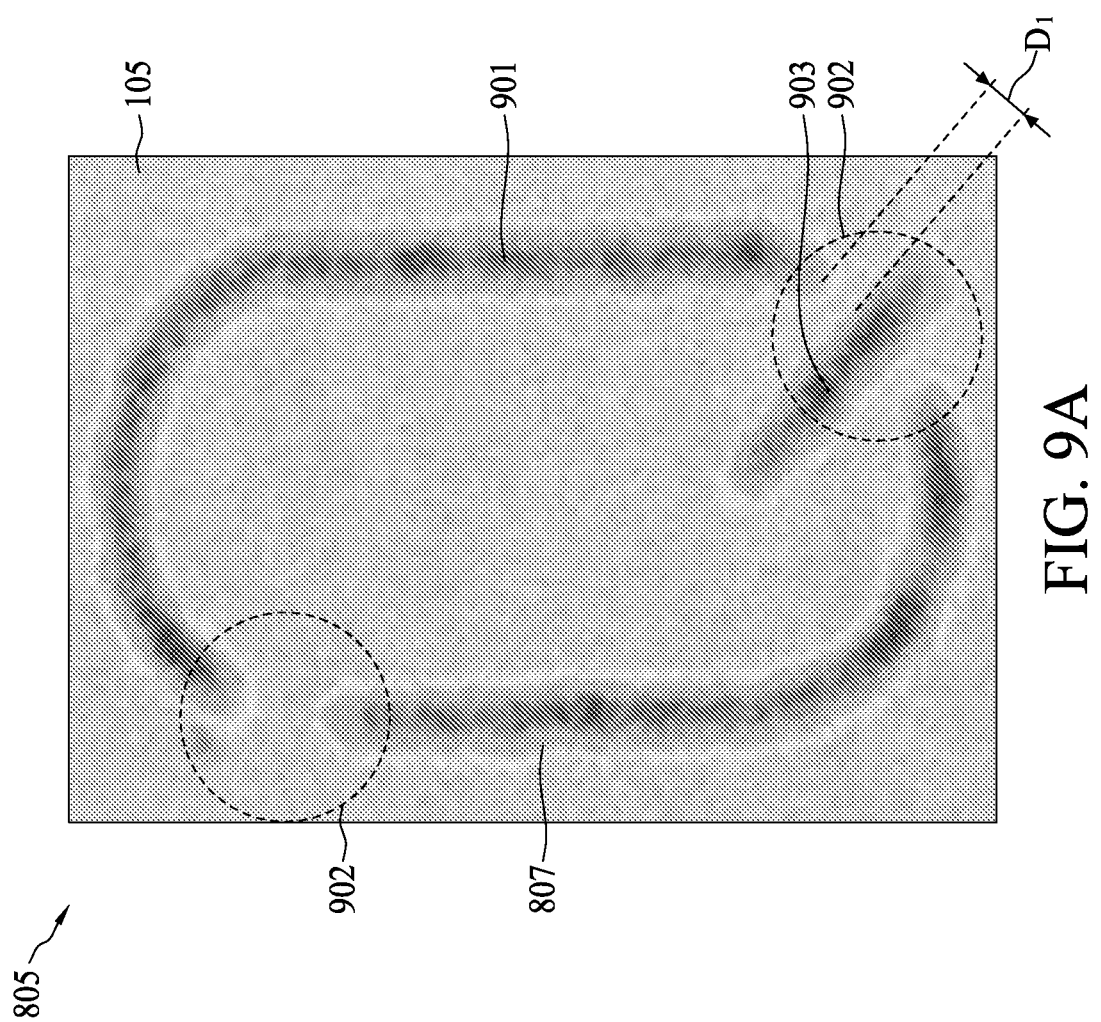
FIGS. 9A-9B illustrate an alphanumeric character formed using the marking process in accordance with some embodiments.

FIG. 9A illustrates one embodiment that may be used to reduce or eliminate the defects caused by the marking process 801. In this embodiment, the first line 807 (illustrated with a curved portion) is utilized along with a second line 901 and a third line 903 to collectively form a letter "Q" within the polymer layer 105. In an embodiment the second line 901 and the third line 903 may be formed using a similar process as the first line 807. For example, a series of laser beam pulses 804 may be used to form overlapping laser beam pulse exposures 809 within the polymer layer 105, wherein the combination of laser beam pulse exposures 809 collectively form the second line 901 and, separately, form the third line 903.

However, in order to prevent any additional removal of the material of the polymer layer 105 beyond the material already removed during the formation of the individual lines (discussed above with respect to FIG. 8B), the mark 805 (e.g., the character "Q") is formed such that there is an overlap count (or a number of passes over a spot) less than one such that the mark 805 is formed to be cross free. For example, the first line 807 may be formed such that the first line 807 does not intersect or overlap either the second line 901 or the third line 903. Similarly, the second line 901 is formed such that the second line 901 does not intersect or overlap either the first line 807 or the third line 903.

Such a prevention creates regions of separation 902 (wherein a longitudinal axis of a first line intersects a longitudinal axis of a second line) wherein the lines that are used to form the desired character (e.g., the first line 807, the second line 901, and the third line 903 to form the letter "Q") collectively form a discontinuous shape. By forming such a discontinuous shape, sections where the lines would have previously intersected and caused undesired and uncontrollable kerf depths may be prevented, and the first depth $D_1$ within the region of separation 902 is the same as the first depth $D_1$ outside of the region of separation 902 (whereas previously the depths have been different when there are multiple passes of the laser beams). As such, fewer defects may arise during the formation of the mark 805. In an embodiment the separation between lines (e.g., between the second line 901 and the third line 903) may be a first distance $D_1$ of between about 10 µm and about 50 µm, such as about 25 µm.

Figure 9B:
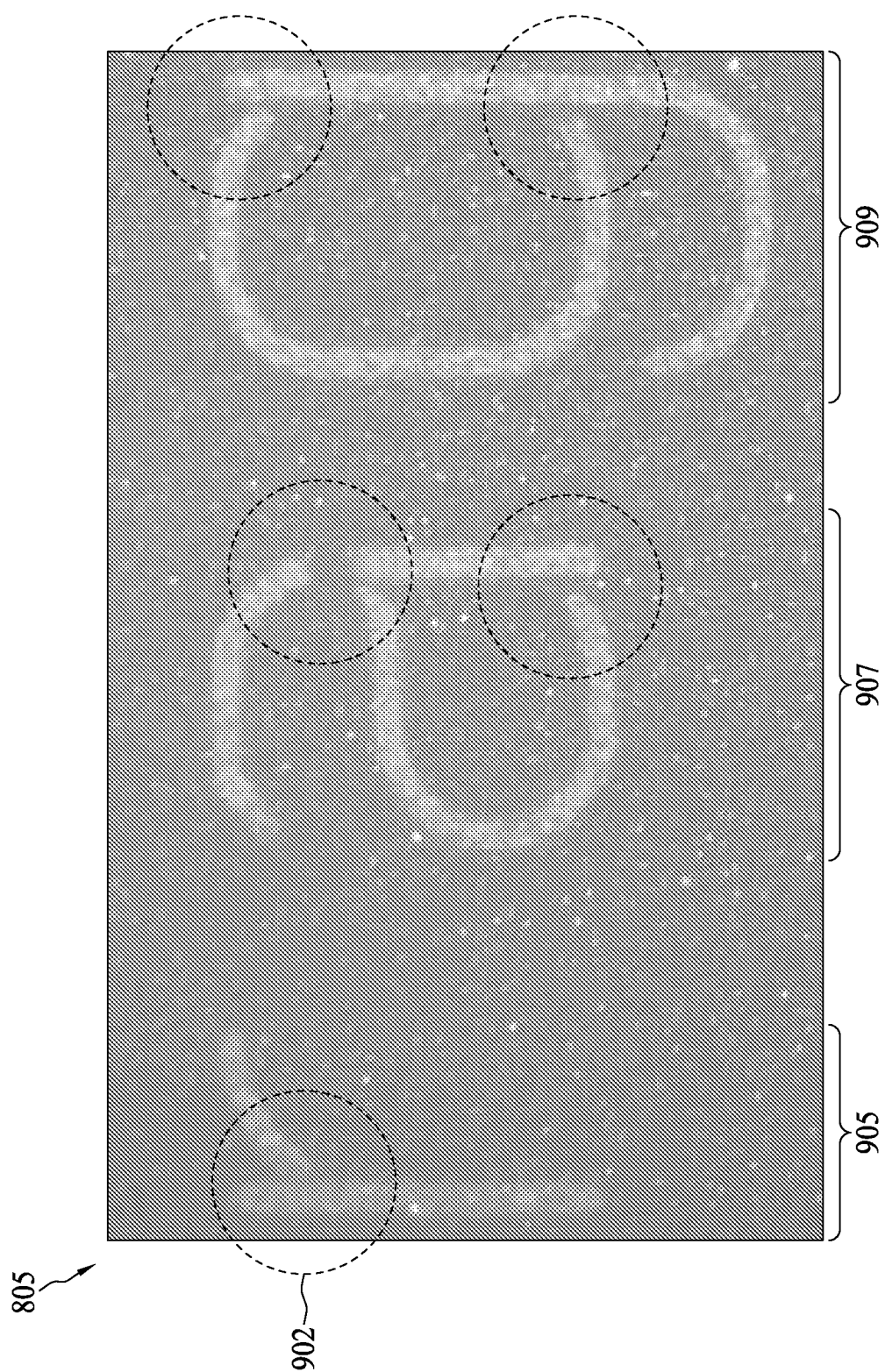

FIG. 9B illustrates additional embodiments of other alphanumeric characters that may be used to form the mark 805 similar to the "Q" illustrated above with respect to FIG. 9A. In particular, FIG. 9B illustrates the lower case letters "r" 905, "a" 907, and "g" 909 that are formed with the cross-free methodology and design. As can be seen, each of these letters is designed and formed with regions of separation 902 in those areas where lines would otherwise intersect.

Figure 10:
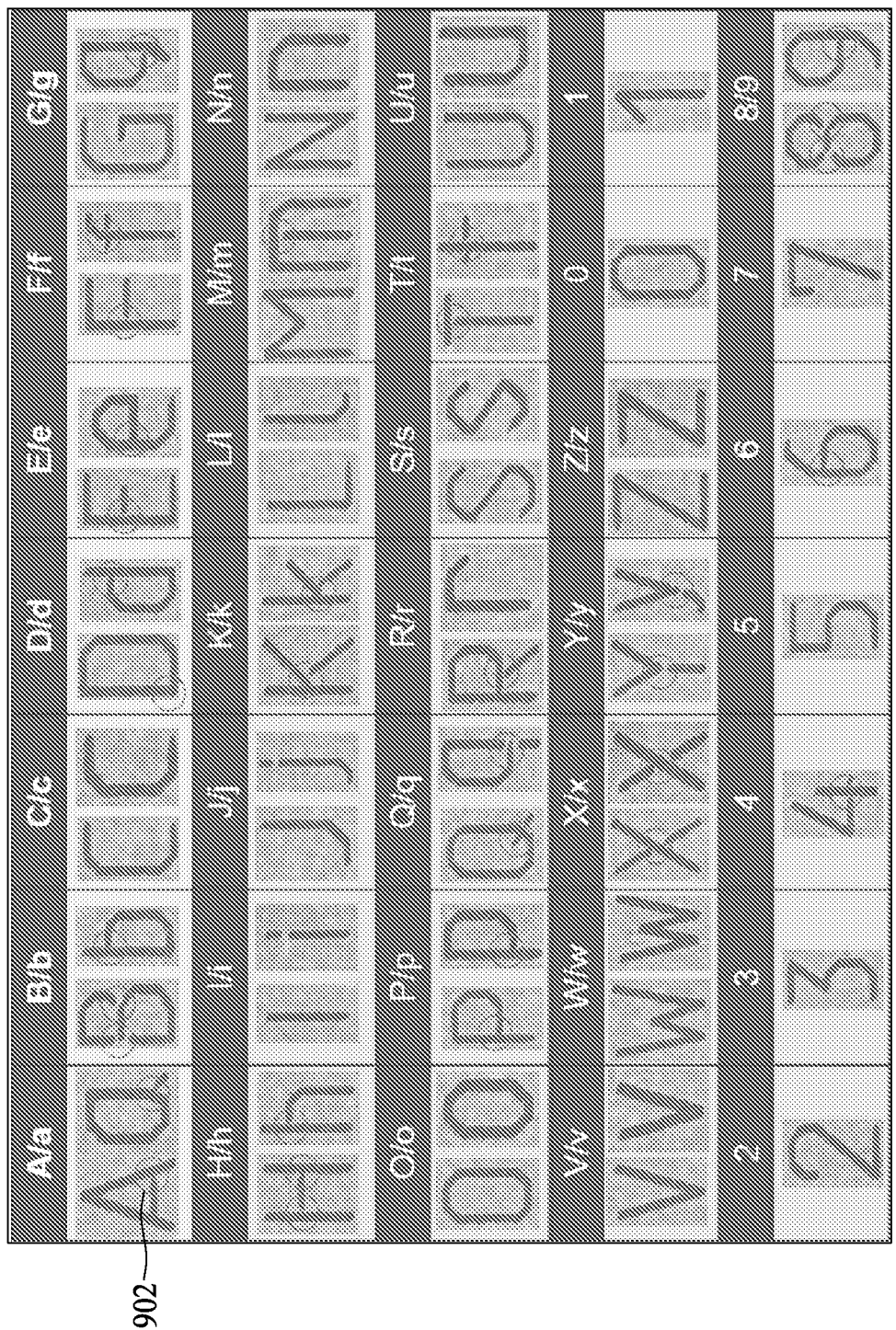
FIG. 10 illustrates a set of alphanumeric characters in accordance with some embodiments.

FIG. 10 illustrates additional embodiments of alphanumeric characters that may be utilized with the cross-free marking process 801. In this collection of alphanumerical upper case and lower case characters, there can be seen regions of separation 902 within some of the individual letters (e.g., the letter "T"), although not every letter has a region of separation 902 (e.g., the letter "L"). In each of these regions of separation 902, the laser marking process forms a separation between lines so as to prevent or mitigate the additional removal of additional material from the polymer layer 105 during the formation of intersecting lines.

By eliminating the overlap between lines, a more controllable kerf depth may be obtained, and package die damage from heat spot effects that can occur and damage the RDL 501, the first semiconductor device 201, and the second semiconductor device 301 when the polymer layer 105 becomes thinner during an uncontrolled marking processes may be reduced or eliminated. As such, a thinner polymer layer 105 may be used while maintaining an effective thermal control and an overall form factor reduction may be achieved while also improving the overall yield of manufactured devices.

For example, in a particular embodiment the first depth $D_1$ within an individual one of the laser beam pulse exposures 809 (see FIG. 8B) may vary between 6.87 μm to 8.03 μm, with an average of about 7.455 μm and a variation of about 1.16 μm. This is lower than in a multiple pass, non-cross-free method, in which the depth may vary from 13.25 μm and 15.92 μm, with an average of 14.757 μm and a variation of 2.67 μm. In another description, by using a cross-free method, the first depth $D_1$ is the depth of a single pass of the laser beam, such as about 7.52 μm, while multiple passes of the laser beam, such as two-passes of the laser beam with an overlap count of 2, may have a depth of 15.8 μm. By reducing the marking depth, the defects that may occur because of the undesired removal of additional material from the polymer layer 105 may be reduced or eliminated.

Figure 11:
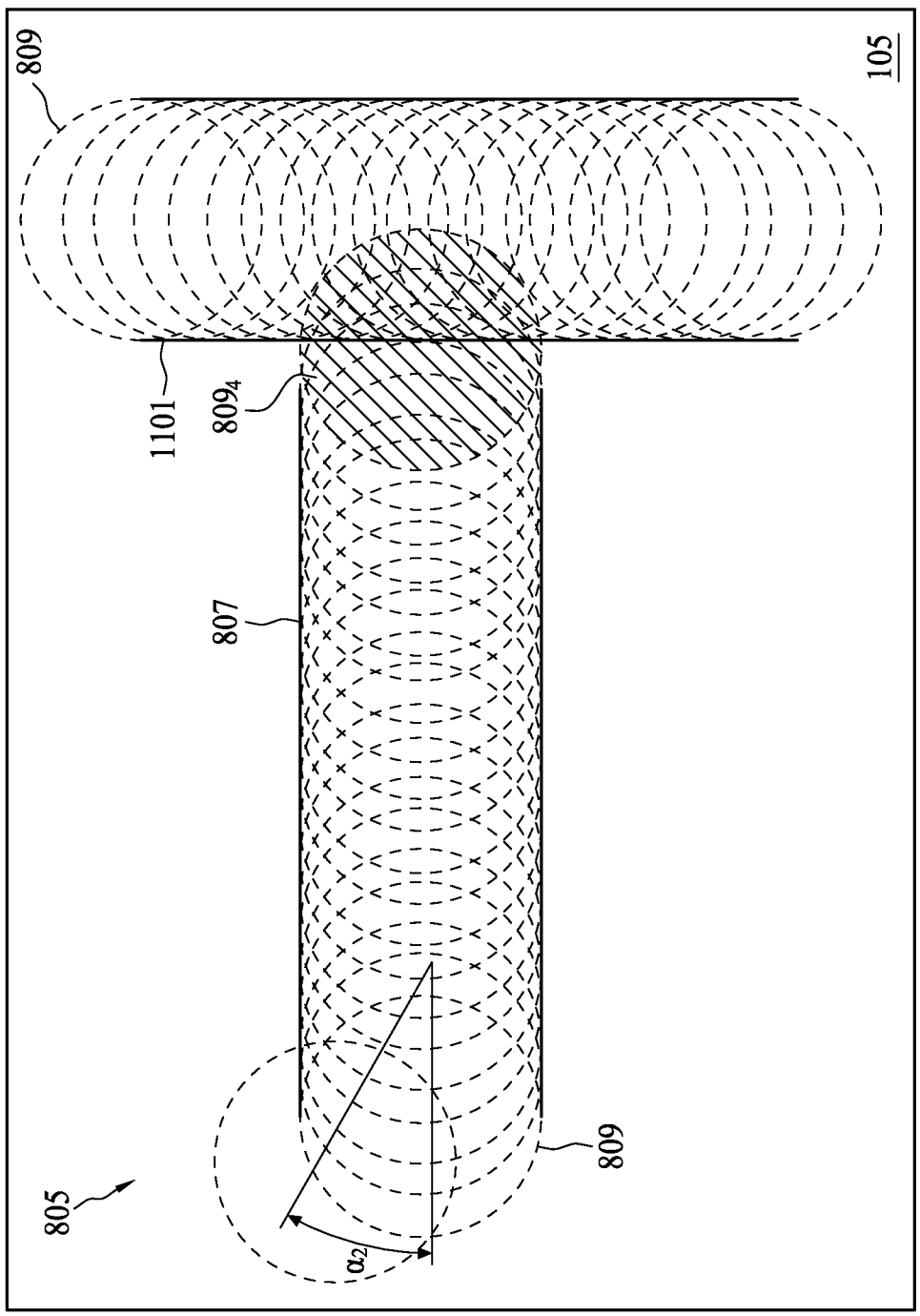
FIG. 11 illustrates a reduced cross marking process in accordance with some embodiments.

FIG. 11 illustrates another embodiment in which the lines within a desired identifying mark 805 may have a reduced overlap count (e.g., an overlap count of less than two) but in which the lines may still have an overlap count greater than one. In this embodiment, rather than having a cross-free character where the individual lines do not intersect, the individual lines within a character may have an overlap count of less than about 2 in an area of intersection between, e.g., the first line 807 with a fourth line 1101. In an embodiment the fourth line 1101 may be formed using a similar process as the one described above with respect to FIG. 8B. For example, a series of laser beam pulses 804 (not separately illustrated in FIG. 11) are used to form laser beam pulse exposures 809 that overlap with each other within the fourth line 1101 to remove material from the polymer layer 105 and form the fourth line 1101, although any suitable method may be utilized.

In this embodiment, however, instead of keeping the first line 807 and the fourth line 1101 from intersecting with each other (and having an overlap count less than one), a partial intersection between the first line 807 and the fourth line 1101 may be made, wherein the laser beam pulse exposures 809 may extend partially into the fourth line 1101. However, instead of the first line 807 extending all of the way into the fourth line 1101 (wherein one of the laser beam pulse exposures 809 from the first line 807 is fully overlapped by the fourth line 1101, thereby having an overlap count of 2), the first line 807 may partially extend into the fourth line 1101 so that the first line 807 has an overlap count of less than about 2.

In this embodiment, an intersecting laser beam pulse exposure $809_4$ (highlighted in FIG. 11 by the shaded region) is part of the first line 807, but also extends at least partially into the fourth line 1101. However, by limiting the intersection of the first line 807 and the fourth line 1101, the amount of overlap may be kept small and defects may be minimized. In an embodiment the overlap count for the intersecting laser beam pulse exposure $809_4$ is less than two and has an accumulated overlap percentage (between overlapping laser beam pulse exposures 809 from both the first line 807 and the fourth line 1101) greater than about 376% and less than 752%, such as about 564%.

Such a prevention also forms the first depth $D_1$ (see FIG. 8A) within the polymer layer 105 to have a different depth within the region of intersection than outside of the region of intersection (as there have been additional exposures of the material of the polymer layer 105 to the laser beams). As such, in an embodiment, the first depth $D_1$ within the intersecting laser beam pulse exposure $809_4$ may be between about 5 μm and about 18 μm, such as about 14 μm. However, any suitable depth may be used.

Additionally in the embodiment illustrated in FIG. 11, in order to help with the overlapping between the individual ones of the laser beam pulse exposures 809, in an embodiment the path angle should be maintained low so that additional overlapping does not occur between a first portion of the first line 807 and a second portion of the first line 807. For example, in an embodiment the marking path may be maintained to have a second angle $\alpha_2$ of between about 20° and about 90°, such as less than about 88°. However, any suitable second angle $\alpha_2$ may be used.

By limiting the amount of overlap between intersecting lines (e.g., the first line 807 and the fourth line 1101), defects that may occur due to the marking process 801 may be reduced without completely separating the intersecting lines. As such, defects may be reduced or mitigated while still forming an intersection between the lines used to form the mark 805.

Figure 12:
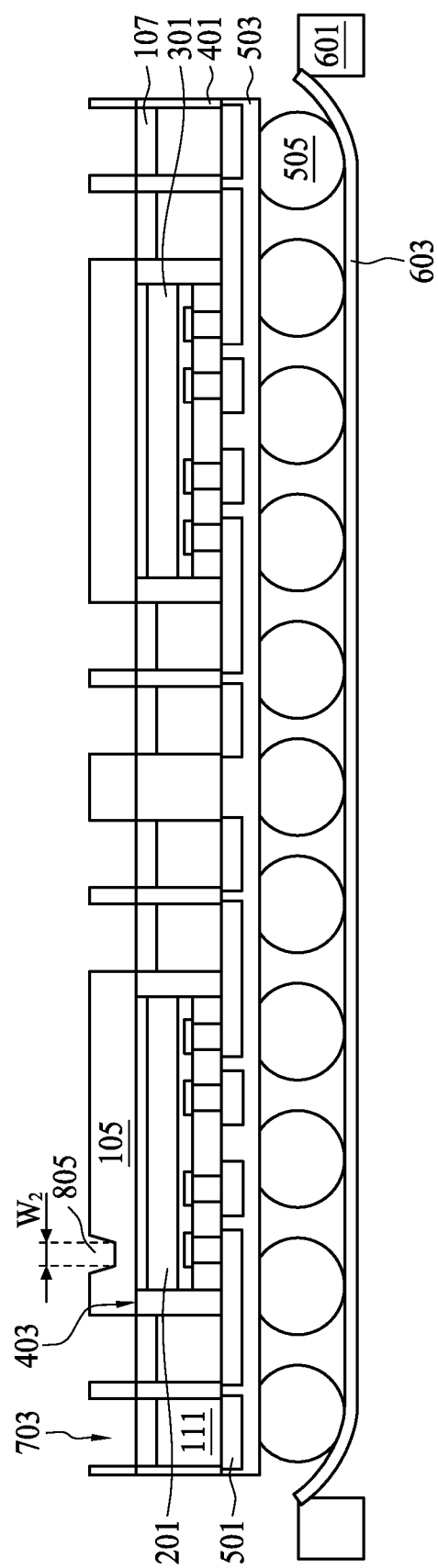
FIG. 12 illustrates placing the mark over the encapsulant in accordance with some embodiments.

FIG. 12 illustrates yet another embodiment in which one or more of the marks 805 (formed using any of the methods described herein), instead of being formed within the polymer layer 105 over the first semiconductor device 201 and the second semiconductor device 301, are formed within the polymer layer 105 over the first region 403 of the encapsulant 401. By forming the marks 805 within the polymer layer 105 over the first region 403 of the encapsulant 401 and not over the first semiconductor device 201 and the second semiconductor device 301, the deleterious effects of the laser beam pulses 804 will be primarily limited to the encapsulant 401 and away from the first semiconductor device 201 and the second semiconductor device 301. As such, the first semiconductor device 201 and the second semiconductor device 301 may have a reduced instance of defects caused by the laser beam pulses 804.

In an embodiment the marks 805 are formed over the first region 403 of the encapsulant 401 and do not extend beyond the first region 403 of the encapsulant 401. As such, in an embodiment in which the first region 403 of the encapsulant 401 has the first width $W_1$ (as described above with respect to FIG. 4), the marks 805 have a second width $W_2$ that is less than the first width $W_1$, such as by being between about 100 μm and about 850 μm, such as about 450 μm, although any suitable dimensions may alternatively be utilized.

By forming the marks 805 over the encapsulant 401 and without extending over the first semiconductor device 201 or the second semiconductor device 301, such that the marks 805 are over the fan out area, any damage that may occur because of an ill-controlled kerf depth during the marking process 801 may be mitigated. Additionally, any backside induced heat spot effects or other damage may be reduced or eliminated. All such improvements help to increase the yield and efficiency of the manufactured devices.

Figure 13:
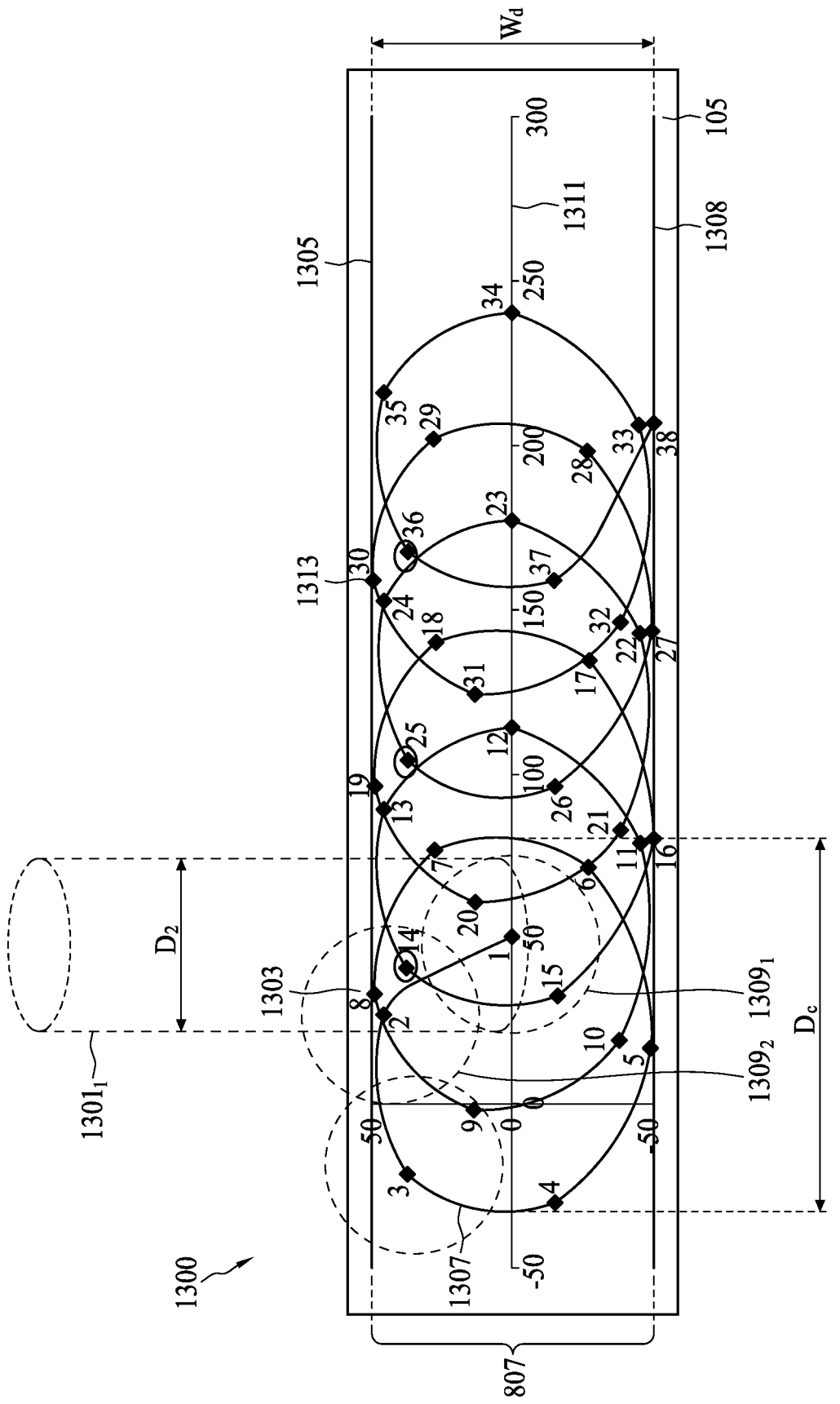
FIG. 13 illustrates a wobble scan in accordance with some embodiments.

FIG. 13 illustrates another embodiment which uses a wobble marking process 1300 to form the first line 807, and which may or may not be used with an overlap count greater than one or two. In this embodiment, rather than using the laser beam pulses 804 that had the first diameter $D_1$ which is equal to the dot width $W_d$ of the first line 807 (as described above with respect to FIG. 8B), a series of wobble laser beam pulses 1301 (only the first of which is illustrated in FIG. 13 for clarity) with a second diameter $D_2$ that may be similar to the first diameter $D_1$ are utilized to form an outline 1303 that extends from a first side 1305 of the first line 807 to a second side 1308 of the first line 807, wherein the outline 1303 will extend across the dot width $W_d$ to form the first line 807. In an embodiment the wobble laser beam pulses 1301 have the second diameter $D_2$, which may be between about 20 μm and about 120 μm, such as about 50 μm. Additionally, the wobble laser beam pulses 1301 may have an energy density of between about $1.0 \times 10^{-3}$ J/mm$^2$ and about $5.0 \times 10^{-2}$ J/mm$^2$, such as about $1.5 \times 10^{-2}$ J/mm$^2$, and the polymer layer 105 is exposed for a time period of between about $1.0 \times 10^{-5}$ sec and about $8.0 \times 10^{-5}$ sec, such as about $2.8 \times 10^{-5}$ sec.

In order to form the first line 807 using the wobble marking process 1300, a scan trace path 1307 may initially be generated where the first line 807 is desired to be formed. While the scan trace path 1307 is not physically formed within the polymer layer 105, the scan trace path 1307 may be used by the laser control machine to place a series of wobble scan laser beam pulse exposures (represented in FIG. 13 by the dashed circles labeled 1309).

To begin the scan trace path 1307, the dot width $W_d$ is identified, and a line representative of the first side 1305 of the first line 807 and a line representative of the second side 1308 of the first line 807 are identified. In an embodiment the dot width $W_d$ of the first line 807 in the wobble marking process 1300 is between about 200 μm and about 80 μm, such as about 150 μm. However, any suitable length for the dot width $W_d$ may be utilized.

Once the dot width $W_d$ has been identified, and the first side 1305 of the first line 807 and the second side 1308 of the first line 807 have been identified, the scan trace path 1307 may be identified. In an embodiment a series of points 1313 (labeled in order from 1-38 in FIG. 13) may be placed in relation to a center line 1311 (between the first side 1305 and the second side 1308 of the first line 807), the first side 1305, and the second side 1308 of the first line 807. The precise location of the series of points 1313 may be stored in, e.g., a computer readable storage medium such as a hard drive or other memory device. Once the series of points 1313 have been placed, individual arcs of the scan trace path 1307 may be formed to extend in order (e.g., from point "1" to point "2" and from point "2" to point "3") between the points and form the scan trace path 1307 in preparation for the wobble laser beam pulses 1301.

Overall, the individual arcs of the scan trace path 1307 may collectively form a circular path that "wobbles" through the center line 1311 from the first side 1305 of the first line 807 to the second side 1308 of the first line 807. In an embodiment the scan trace path 1307 (after making at least a first full rotation) will, after crossing the center line 1311, cross itself at least once, if not more, before again crossing the center line 1311. In a particular embodiment, the intersection of the scan trace path 1307 with the center line 1311 as the scan trace path 1307 moves from point to point may be a crossing distance $D_c$ of between about 50 μm and about 200 μm, such as about 100 μm.

However, while the scan trace path 1307 may maintain a relatively constant distance between intersections with the center line 1311, a constant distance is not intended to be limiting upon the embodiments. Rather, the crossing distance $D_c$ may be variable along the scan trace path 1307, such that the scan trace path 1307 may have varying distances of intersection along the first line 807. Any suitable length may be used for the crossing distance $D_c$ at any point along the scan trace path 1307.

Once the scan trace path 1313 has been determined, the series of wobble laser beam pulses 1301 may be used to form the series of wobble laser beam pulse exposures 1309 (only a small number of which are illustrated in FIG. 13) along the scan trace path 1307, with individual ones of the series of wobble laser beam pulse exposures corresponding with a respective one of the points (e.g., point "1," point "2," point "3," etc.) as the exposures follow the marking trajectory along the labels #1, #2, #3, etc. In an embodiment the wobble laser beam pulses exposures 1309 are formed at least partially overlapping each other in order to form the outline 1303 for the first line 807. For example, the second wobble laser beam pulse exposure $1309_2$ (at point "2") may be offset from the first wobble laser beam pulse exposure $1309_1$ (at point "1") by an offset of between about 5 μm and about 100 μm, such as about 50 μm. However, any suitable offset between the second wobble laser beam pulse exposure $1309_2$ and the first wobble laser beam pulse exposure $1309_1$ may be used.

The series of wobble laser beam pulses 1301 is used to form the series of wobble laser beam pulse exposures 1309 along the scan trace path 1307. As the series of wobble laser beam pulse exposures 1309 are formed the outline 1303 will create the first line 807. By continuing the scan trace path 1307 and the formation of the wobble laser beam pulse exposures 1309 along the scan trace path 1307, the first line 807 may be made in any desired length or shape.

Additionally, once the first line 807 is formed, it may be combined with other lines to form any desired characters. However, by forming the first line 807 using the wobble laser beam pulse exposures 1309, the overall amount of material from the polymer layer 105 that is removed is reduced from within the first line 807. As such, fewer defects may be caused.

Figure 14:
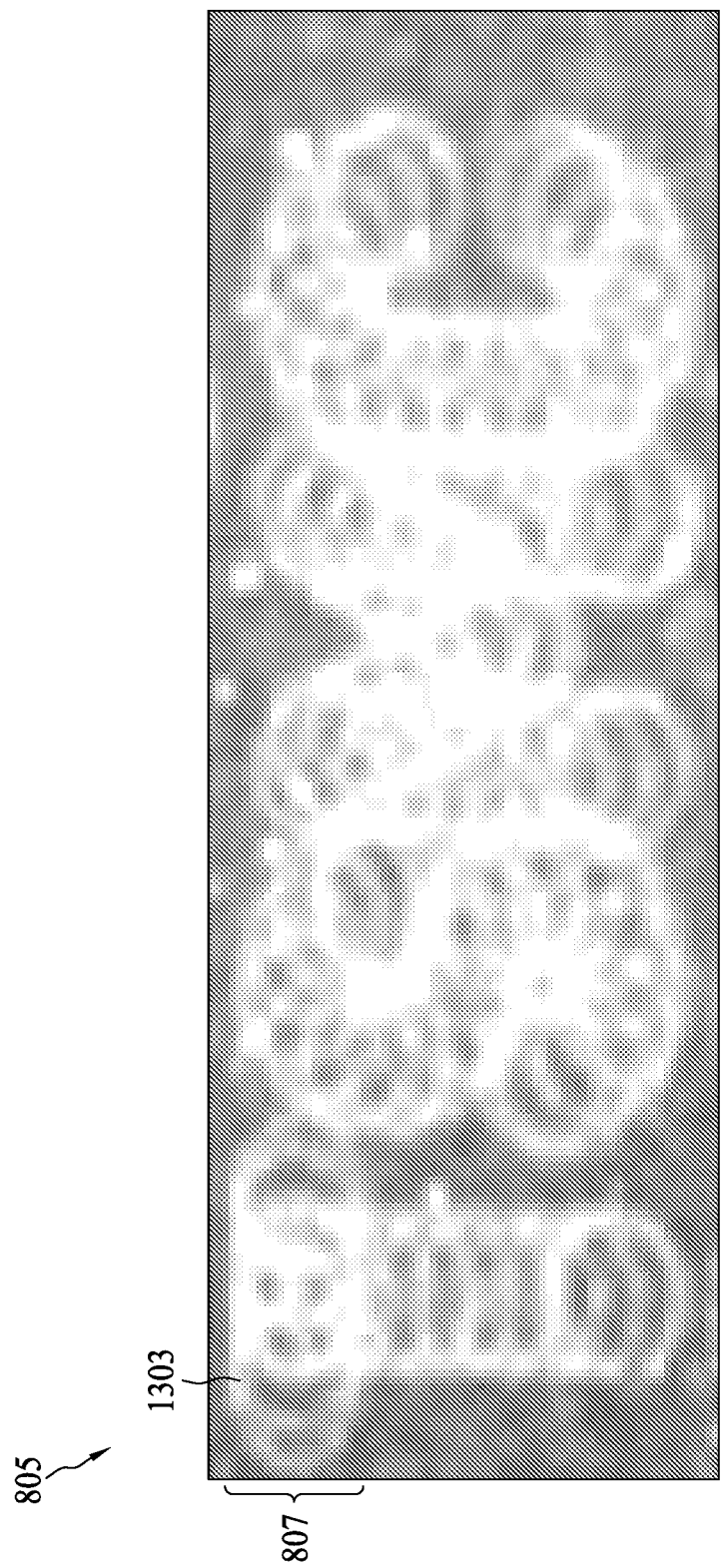
FIG. 14 illustrates a specific example of a marking formed using the wobble scan in accordance with some embodiments.

FIG. 14 illustrates a mark 805 formed using the first line 807 formed with the wobble marking process 1300 (see FIG. 13). As illustrated, the outline 1303 formed using the wobble marking process 1300 can be used to form characters, such as the letter "T", "S", "M", and "C." However, by using the wobble laser beam pulses 1301, the letters are not solid but are, rather, outlined using the wobble laser beam pulse exposures 1309 (not individually illustrated in FIG. 14), and a smaller portion of the polymer layer 105 is removed for each line (e.g., the first line 807). Such a reduction helps to mitigate or eliminate defects caused by the laser marking process.

Additionally, if desired, the first line 807 formed using the wobble marking process 1300 may be used by itself or else combined with the other processes described above with respect to FIGS. 8A-12. For example, the wobble marking process 1300 may be used to make lines that are utilized in the cross-free characters as described above, or else may be used to make line that intersect with a reduced overlap count. Additionally, lines formed using the wobble marking process 1300 may be formed over the first region 403 of the encapsulant 401 without extending over the first semiconductor device 201 and the second semiconductor device 301. All suitable combinations of the processes described herein are fully intended to be included within the scope of the embodiments.

Figure 15:
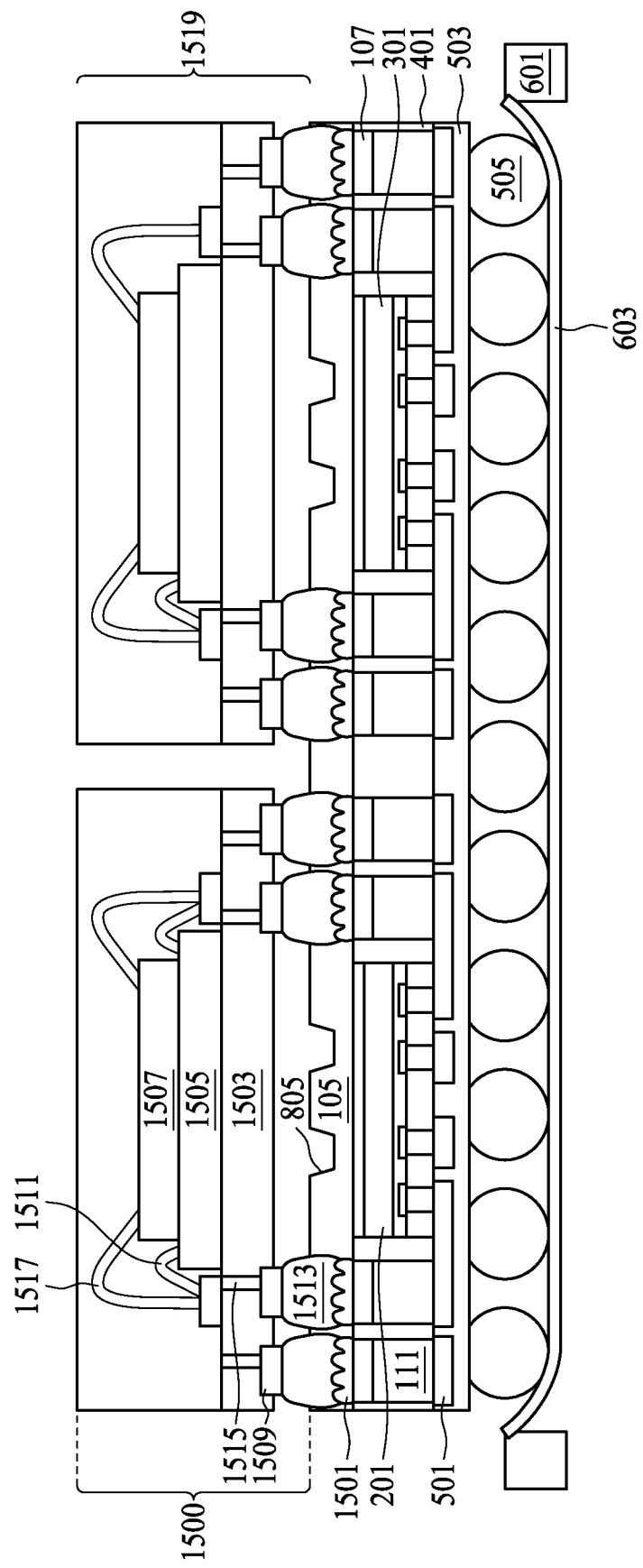
FIG. 15 illustrates a package on package in accordance with some embodiments.
Figure 16:
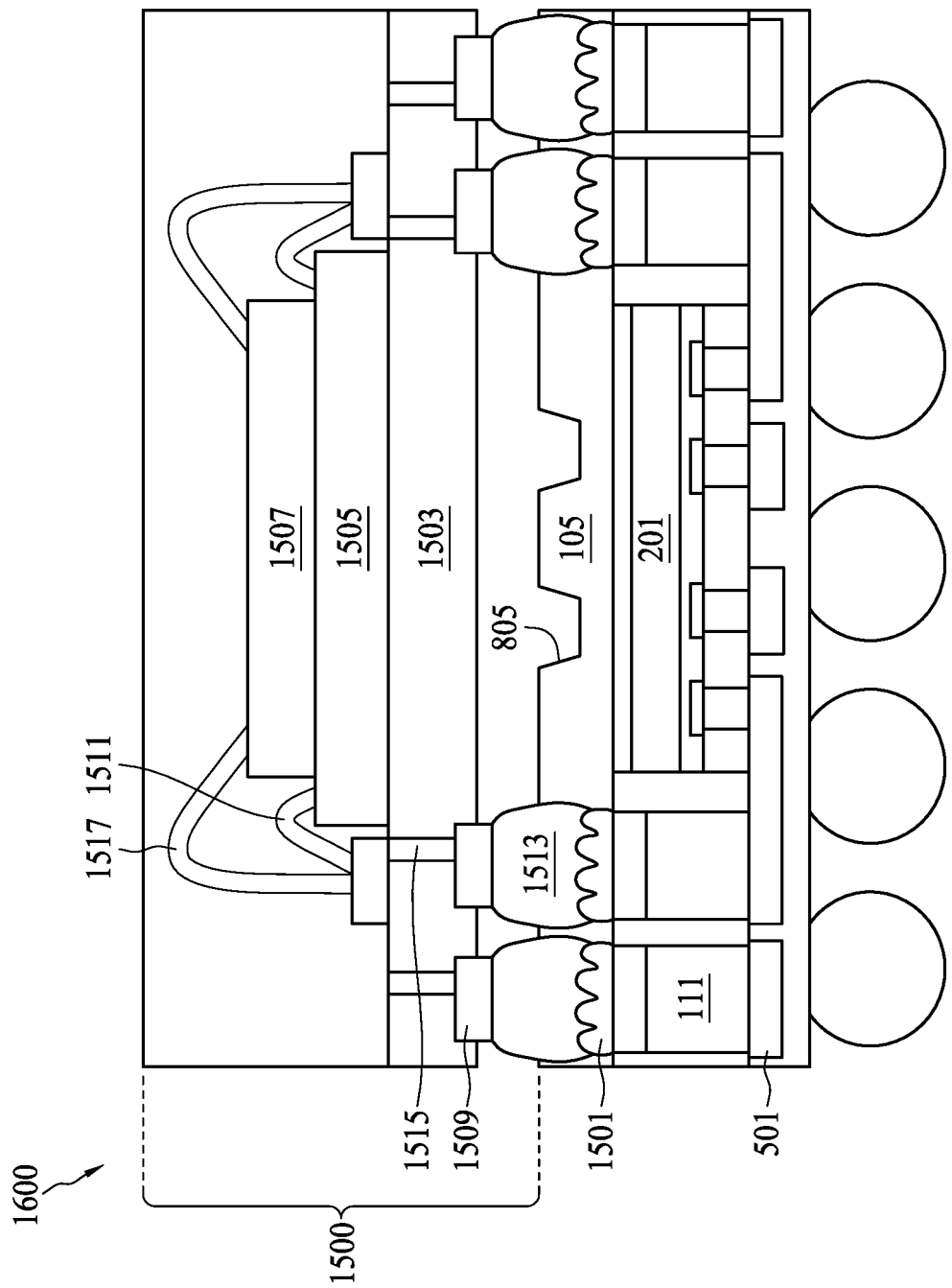
FIG. 16 illustrates a singulation of the package on package structure in accordance with some embodiments.

FIG. 15 illustrates that, once the marks 805 have been formed within the polymer layer 105, the structure may be bonded to a second package to form a first integrated fan out package-on-package (InFO-POP) structure 1600 (see FIG. 16). FIG. 15 illustrates a bonding of backside ball pads 1501 to a first package 1500. In an embodiment the backside ball pads 1501 may be used to protect the exposed vias 111 and comprise a conductive material such as solder paste or an oxygen solder protection (OSP), although any suitable material may alternatively be utilized. In an embodiment the backside ball pads 1501 may be applied using a stencil, although any suitable method of application may alternatively be utilized, and then reflowed in order to form a bump shape.

The first package 1500 may comprise a third substrate 1503, a third semiconductor device 1505, a fourth semiconductor device 1507 (bonded to the third semiconductor device 1505), third contact pads 1509, a second encapsulant 1511, and fourth external connections 1513. In an embodiment the third substrate 1503 may be, e.g., a packaging substrate comprising internal interconnects (e.g., through substrate vias 1515) to connect the third semiconductor device 1505 and the fourth semiconductor device 1507 to the backside ball pads 1501.

Alternatively, the third substrate 1503 may be an interposer used as an intermediate substrate to connect the third semiconductor device 1505 and the fourth semiconductor device 1507 to the backside ball pads 1501. In this embodiment the third substrate 1503 may be, e.g., a silicon substrate, doped or undoped, or an active layer of a silicon-on-insulator (SOI) substrate. However, the third substrate 1503 may alternatively be a glass substrate, a ceramic substrate, a polymer substrate, or any other substrate that may provide a suitable protection and/or interconnection functionality. These and any other suitable materials may alternatively be used for the third substrate 1503.

The third semiconductor device 1505 may be a semiconductor device designed for an intended purpose such as being a logic die, a central processing unit (CPU) die, a memory die (e.g., a DRAM die), combinations of these, or the like. In an embodiment the third semiconductor device 1505 comprises integrated circuit devices, such as transistors, capacitors, inductors, resistors, first metallization layers (not shown), and the like, therein, as desired for a particular functionality. In an embodiment the third semiconductor device 1505 is designed and manufactured to work in conjunction with or concurrently with the first semiconductor device 201.

The fourth semiconductor device 1507 may be similar to the third semiconductor device 1505. For example, the fourth semiconductor device 1507 may be a semiconductor device designed for an intended purpose (e.g., a DRAM die) and comprising integrated circuit devices for a desired functionality. In an embodiment the fourth semiconductor device 1507 is designed to work in conjunction with or concurrently with the first semiconductor device 201 and/or the third semiconductor device 1505.

The fourth semiconductor device 1507 may be bonded to the third semiconductor device 1505. In an embodiment the fourth semiconductor device 1507 is only physically bonded with the third semiconductor device 1505, such as by using an adhesive. In this embodiment the fourth semiconductor device 1507 and the third semiconductor device 1505 may be electrically connected to the third substrate 1503 using, e.g., wire bonds 1517, although any suitable electrical bonding may alternatively be utilized.

Alternatively, the fourth semiconductor device 1507 may be bonded to the third semiconductor device 1505 both physically and electrically. In this embodiment the fourth semiconductor device 1507 may comprise fourth external connections (not separately illustrated in FIG. 15) that connect with fifth external connection (also not separately illustrated in FIG. 15) on the third semiconductor device 1505 in order to interconnect the fourth semiconductor device 1507 with the third semiconductor device 1505.

The third contact pads 1509 may be formed on the third substrate 1503 to form electrical connections between the third semiconductor device 1505 and, e.g., the fourth external connections 1513. In an embodiment the third contact pads 1509 may be formed over and in electrical contact with electrical routing (such as through substrate vias 1515) within the third substrate 1503. The third contact pads 1509 may comprise aluminum, but other materials, such as copper, may alternatively be used. The third contact pads 1509 may be formed using a deposition process, such as sputtering, to form a layer of material (not shown) and portions of the layer of material may then be removed through a suitable process (such as photolithographic masking and etching) to form the third contact pads 1509. However, any other suitable process may be utilized to form the third contact pads 1509.

The second encapsulant 1511 may be used to encapsulate and protect the third semiconductor device 1505, the fourth semiconductor device 1507, and the third substrate 1503. In an embodiment the second encapsulant 1511 may be a molding compound and may be placed using a molding device (not illustrated in FIG. 15). For example, the third substrate 1503, the third semiconductor device 1505, and the fourth semiconductor device 1507 may be placed within a cavity of the molding device, and the cavity may be hermetically sealed. The second encapsulant 1511 may be placed within the cavity either before the cavity is hermetically sealed or else may be injected into the cavity through an injection port. In an embodiment the second encapsulant 1511 may be a molding compound resin such as polyimide, PPS, PEEK, PES, a heat resistant crystal resin, combinations of these, or the like.

Once the second encapsulant 1511 has been placed into the cavity such that the second encapsulant 1511 encapsulates the region around the third substrate 1503, the third semiconductor device 1505, and the fourth semiconductor device 1507, the second encapsulant 1511 may be cured in order to harden the second encapsulant 1511 for optimum protection. While the exact curing process is dependent at least in part on the particular material chosen for the second encapsulant 1511, in an embodiment in which molding compound is chosen as the second encapsulant 1511, the curing could occur through a process such as heating the second encapsulant 1511 to between about 100° C. and about 130° C., for about 60 sec to about 3000 sec. Additionally, initiators and/or catalysts may be included within the second encapsulant 1511 to better control the curing process.

However, as one having ordinary skill in the art will recognize, the curing process described above is merely an exemplary process and is not meant to limit the current embodiments. Other curing processes, such as irradiation or even allowing the second encapsulant 1511 to harden at ambient temperature, may alternatively be used. Any suitable curing process may be used, and all such processes are fully intended to be included within the scope of the embodiments discussed herein.

In an embodiment the fourth external connections 1513 may be formed to provide an external connection between the third substrate 1503 and, e.g., the backside ball pads 1501. The fourth external connections 1513 may be contact bumps such as microbumps or controlled collapse chip connection (C4) bumps and may comprise a material such as tin, or other suitable materials, such as silver or copper. In an embodiment in which the fourth external connections 1513 are tin solder bumps, the fourth external connections 1513 may be formed by initially forming a layer of tin through any suitable method such as evaporation, electroplating, printing, solder transfer, ball placement, etc. Once a layer of tin has been formed on the structure, a reflow is performed in order to shape the material into the desired bump shape.

Once the fourth external connections 1513 have been formed, the fourth external connections 1513 are aligned with and placed into physical contact with the backside ball pads 1501, and a bonding is performed. For example, in an embodiment in which the fourth external connections 1513 are solder bumps, the bonding process may comprise a reflow process whereby the temperature of the fourth external connections 1513 is raised to a point where the fourth external connections 1513 will liquefy and flow, thereby bonding the first package 1500 to the backside ball pads 1501 once the fourth external connections 1513 resolidifies.

FIG. 15 additionally illustrates the bonding of a second package 1519 to the backside ball pads 1501. In an embodiment the second package 1519 may be similar to the first package 1500, and may be bonded to the backside ball pads 1501 utilizing similar processes. However, the second package 1519 may also be different from the first package 1500.

FIG. 16 illustrates a debonding of the third external connectors 505 from the ring structure 601 and a singulation of the structure to form the first integrated fan out package-on-package (InFO-POP) structure 1600. In an embodiment the third external connectors 505 may be debonded from the ring structure 601 by initially bonding the first package 1500 and the second package 1519 to a second ring structure using, e.g., a second ultraviolet tape. Once bonded, the ultraviolet tape 603 may be irradiated with ultraviolet radiation and, once the ultraviolet tape 603 has lost its adhesiveness, the third external connectors 505 may be physically separated from the ring structure 601.

Once debonded, a singulation of the structure to form the first InFO-POP structure 1600 is performed. In an embodiment the singulation may be performed by using a saw blade (not shown) to slice through the encapsulant 401 and the polymer layer 105 between the vias 111, thereby separating one section from another to form the first InFO-POP structure 1600 with the first semiconductor device 201. However, as one of ordinary skill in the art will recognize, utilizing a saw blade to singulate the first InFO-POP structure 1600 is merely one illustrative embodiment and is not intended to be limiting. Alternative methods for singulating the first InFO-POP structure 1600, such as utilizing one or more etches to separate the first InFO-POP structure 1600, may alternatively be utilized. These methods and any other suitable methods may alternatively be utilized to singulate the first InFO-POP structure 1600.

In accordance with an embodiment, a semiconductor device comprising a semiconductor device with an encapsulant and a via extending through the encapsulant and laterally separated from the semiconductor device is provided. A protective layer is over the encapsulant and the via. A marking is within the protective layer, the marking comprising a cross-free character.

In accordance with another embodiment, a semiconductor device comprising a semiconductor die and a conductive via laterally separated from the semiconductor die is provided. An encapsulant is located between the semiconductor die and the conductive via, and a protective material over the encapsulant. A marking character is within the protective material, wherein the marking character has an overlap count of less than two.

In accordance with yet another embodiment, a semiconductor device comprising a semiconductor die laterally separated from a conductive via and an encapsulant encapsulating both the semiconductor die and the conductive via is provided. A layer of material is over the semiconductor die, the encapsulant, and the conductive via. A character is marked into the layer of material, wherein the character comprises a plurality of laser pulse exposure regions, each of the laser pulse exposure regions having a diameter of less than about 100 μm and each of which is aligned along a circular trace path, the circular trace path outlining the character.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor device separated from a through via by an encapsulant, wherein a protective layer is located over the first semiconductor device and wherein the through via has multiple surfaces planar with the first semiconductor device; and
   a circular path traced across the protective layer by a plurality of circular indentations, wherein each of the plurality of circular indentations has a diameter of less than about 100 μm.

2. The semiconductor device of claim 1, wherein the circular path has a crossing distance of between about 50 μm and about 200 μm.

3. The semiconductor device of claim 2, wherein the circular path has a crossing distance of between about 50 μm and about 100 μm.

4. The semiconductor device of claim 1, wherein the circular path has a variable crossing distance.

5. The semiconductor device of claim 1, wherein the plurality of circular indentations at least partially overlap each other.

6. The semiconductor device of claim 1, wherein the circular path forms a line, the line having a dot width of between about 80 μm and about 200 μm.

7. The semiconductor device of claim 6, wherein the line has an overlap count greater than two.

8. A semiconductor device comprising:
   a protective layer located over a first semiconductor device, the first semiconductor device being encapsulated by an encapsulant;
   through vias extending through the encapsulant, wherein at least one of the through vias has a straight sidewall that extends from a first side of the encapsulant to a second side of the encapsulant opposite the first side; and
   a plurality of circular indentations extending into the protective layer and having a diameter of less than about 100 µm, the plurality of circular indentations located along a circular path traced across the protective layer by the plurality of circular indentations.

9. The semiconductor device of claim 8, wherein the circular path forms a line.

10. The semiconductor device of claim 9, wherein the circular path has a crossing distance within the line of between about 50 µm and about 200 µm.

11. The semiconductor device of claim 10, wherein the circular path has a crossing distance within the line of between about 50 µm and about 100 µm.

12. The semiconductor device of claim 9, wherein the line has a variable crossing distance.

13. The semiconductor device of claim 9, wherein the line has a dot width of between about 8 µm and about 150 µm.

14. The semiconductor device of claim 8, wherein the circular indentations have a diameter of between about 20 µm and about 50 µm.

15. A semiconductor device comprising:
an encapsulant encapsulating a first semiconductor die and a through via; and
a protective layer overlying at least the first semiconductor die and the encapsulant, wherein a top surface of the protective layer comprises multiple overlapping indentations, each one of the multiple overlapping indentations being circular in shape and having a diameter of no greater than about 100 µm, the multiple overlapping indentations forming a curved line, the curved line having a dot width that is greater than the diameter.

16. The semiconductor device of claim 15, further comprising a redistribution layer located across the encapsulant from the protective layer.

17. The semiconductor device of claim 15, wherein the multiple overlapping indentations wobble through a centerline of a line.

18. The semiconductor device of claim 17, wherein the line has a dot width between about 80 µm and about 200 µm.

19. The semiconductor device of claim 15, wherein each of the multiple overlapping indentations has a diameter of between about 20 µm and about 50 µm.

20. The semiconductor device of claim 15, wherein the through via is recessed within the encapsulant.

* * * * *